(12) United States Patent
Pauli et al.

(10) Patent No.: US 7,948,128 B2
(45) Date of Patent: May 24, 2011

(54) CONNECTING SUPPORT FOR HOLDING MOTOR ELECTRONICS

(75) Inventors: Stephan Pauli, Achern (DE); Roland Bohn, Buehl (DE)

(73) Assignee: Robert Bosch GmbH, Stuttgart (DE)

( * ) Notice: Subject to any disclaimer, the term of this patent is extended or adjusted under 35 U.S.C. 154(b) by 59 days.

(21) Appl. No.: 12/305,243

(22) PCT Filed: Aug. 1, 2007

(86) PCT No.: PCT/EP2007/057941
§ 371 (c)(1),
(2), (4) Date: Dec. 17, 2008

(87) PCT Pub. No.: WO2008/037531
PCT Pub. Date: Apr. 3, 2008

(65) Prior Publication Data
US 2009/0206710 A1 Aug. 20, 2009

(30) Foreign Application Priority Data
Sep. 28, 2006 (DE) .......................... 10 2006 045 929

(51) Int. Cl.
*H02K 11/00* (2006.01)
(52) U.S. Cl. ........................................... 310/71
(58) Field of Classification Search ..................... 310/71, 310/89, 68 R
See application file for complete search history.

(56) References Cited

U.S. PATENT DOCUMENTS

| 4,028,738 | A | | 6/1977 | Rouvre et al. | |
| 5,453,649 | A | * | 9/1995 | Blanchet | 310/71 |
| 6,107,713 | A | * | 8/2000 | Hulsmann et al. | 310/75 R |
| 6,858,798 | B2 | | 2/2005 | Felgueroso et al. | |
| 7,728,472 | B2 | * | 6/2010 | Huck et al. | 310/71 |

FOREIGN PATENT DOCUMENTS

| DE | 10246381 A1 | 4/2004 |
| WO | 00/46082 A1 | 8/2000 |

OTHER PUBLICATIONS

PCT/EP2007/057941 International Search Reporrt.

* cited by examiner

*Primary Examiner* — Dang D Le
(74) *Attorney, Agent, or Firm* — Michael Best & Friedrich LLP

(57) ABSTRACT

The invention relates to a connecting support (1) for holding motor electronics on a motor subassembly (2), the connecting support being located between at least two components (3, 4) arranged at a distance from each other on the motor subassembly (2), wherein the connecting support (1) has means (8, 9) by means of which said components (3, 4) are electrically connected to each other, and wherein the connecting support (1) has a supporting structure (5) to which at least individual elements (6, 7) of the motor electronics are fastened.

18 Claims, 3 Drawing Sheets

CONNECTING SUPPORT FOR HOLDING MOTOR ELECTRONICS

BACKGROUND OF THE INVENTION

The invention relates to a connecting support for holding motor electronics, as can be used, in particular, on wiper motors in vehicles.

An established way of using electric motors as drives of wiper systems is embedding an electric motor in a complex assembly, called motor assembly in the text which follows, which, in addition to the actual motor, comprises gear mechanism components, housing parts, fixing means, electrical connection means and motor electronics. In this case, the electrical connection means are frequently arranged in the immediate vicinity of the motor parts with which contact is to be made, in order to be able to realize short conduction paths.

In the interests of simplified connection, the connection plugs used are frequently designed such that the motor assembly is fully ready for operation when said connection plugs are connected. Consequently, components with which contact is to be made and which are arranged at a distance from a corresponding plugging slot or the connection plug have to be connected via separate feed lines which lead from the respective installation site of the components with which contact is to be made to the plugging slot or the connection plug, in order to ensure the ability to make a connection in the manner discussed above in one connection step. Components of this type with which contact is to be made and which have an installation position which differs from the connection plug are, for example, control contacts with which the position of the gear mechanism elements within the motor assembly is detected, in order to be able to correctly control the turning position of a wiper system.

To this end, the control contacts are integrated in a contact holder such that their ends come into electrically conductive contact with moving parts of the gear mechanism, from which parts the precise position of the output shaft on which the wiper blade is located can be derived, or can communicate with them in some other way. In this case, the position of the control contacts is defined by correspondingly fixing the contact holder in an opening in the gear mechanism housing.

Particularly in the case of an arrangement of the connection plug or plugging slot at the end of the motor housing, a relatively large surface area is provided between the control contacts and the connection plug on the motor housing, it being possible on the one hand for said surface area to be used for fixing further construction elements, but on the other hand said surface area having to be bridged by means of corresponding electrical conduction means in order to make contact with the control contacts. This bridging is performed, according to the prior art, by extrusion-coated metal strips which are integrated in the gear mechanism cover or by cables which run freely across the outside of the motor assembly.

The variant with metal strips running in the gear mechanism cover complicates production of the gear mechanism cover and, when adaptations are needed or there are defects in the contact-connection to the control contacts, always requires the replacement of the entire gear mechanism cover. The variant with cables which run freely across the outside of the motor assembly is associated, in particular, with the risk of damage to the cables.

In addition to these contact-making measures, a separate support is often fitted with corresponding motor electronics in the above-mentioned housing region, said motor electronics being partially electrically connected to brush holders/connection plugs and/or control contacts. In this case, mounting the support with the motor electronics therefore constitutes an additional working step which has to be coordinated with the installation of the connecting means between the control contacts on the connection plug.

SUMMARY OF THE INVENTION

The object of the invention is to specify a solution for the electrical connection of two components which are arranged at a distance from one another on a motor assembly, in particular for connecting control contacts to wiper motors, and for fitting the motor electronics, which solution is distinguished by a low level of outlay on installation and improved functional reliability as compared to the prior art.

The object is achieved by a connecting support for holding motor electronics on a motor assembly, which connecting support is located between at least two components which are arranged at a distance from one another on the motor assembly, with the connecting support having means by means of which these components are electrically connected to one another, and with the connecting support having a supporting structure to which at least individual elements of the motor electronics are fixed.

The invention concerns a connecting support for holding motor electronics on a motor assembly, which connecting support is located between at least two components which are arranged at a distance from one another on the motor assembly, with the connecting support having means by means of which these components are electrically connected to one another, and with the connecting support having a supporting structure to which at least individual elements of the motor electronics are fixed. The connecting support according to the invention forms a connection system with a line guide, which is external to the motor housing but is protected, for the electrical connection of at least two components which are arranged at a distance from one another on a motor assembly. Since the geometric profile of the electrical connection is determined, the disadvantages of cables which run freely across the outside of the motor assembly can be avoided. If connecting cables are still required, the profile of the electrical line is selected such that the risk of damage during installation processes which are to be expected is avoided, for example by the connecting support being used as a support and covering element for lines which are guided parallel to it. In addition, the connecting support according to the invention entirely or partially replaces separate supports for holding the motor electronics, since the supporting structure takes over the function of said supports.

The connecting support according to the invention is suitable, in particular, for applications in which the motor assembly is a motor assembly of a wiper drive of a vehicle and at least one of the components which is to be connected by said connecting support and whose positions are preferably fixed in relation to the housing parts of the motor assembly is a contact holder with control contacts for determining the position of at least one gear mechanism element. In this case, the relatively large distance, which is necessary for design reasons, between the contact holder and connection means for connecting the motor assembly can be bridged according to the invention and be used without further separate supports for accommodating motor electronics.

It is advantageous when the supporting structure comprises conductor tracks which connect at least individual elements of the motor electronics to at least one of the components between which the connecting support is arranged. It is also advantageous when the supporting structure comprises conductor tracks which directly connect to one another the components between which the connecting support is arranged. As a result, the supporting structure can replace conventional line connections between said components. It is advantageous and expedient to use one or more printed circuit boards with correspondingly prepared conductor tracks at least as constituent parts of the supporting structure. As an alternative or in addition, it may be advantageous when the supporting structure comprises a plastic part with injection-molded conductive strips or injection-molded cables. The connecting support can likewise additionally be used as a guidance aid for the cables to be laid between the connected components.

It is advantageous when the connecting support is connected to at least one housing part of the motor assembly. The connection to the housing part ensures adequate fixing of position and fixing of the entire connecting support, particularly when the supporting structure is connected to the housing of the motor assembly.

It is particularly advantageous when the connecting support is connected firmly to the housing of a plug or plugging slot by means of which connection is made with the motor assembly, or to a plugging adapter which is arranged between a plug, by means of which the connection is made with the motor assembly, and a corresponding plugging slot. In this case, the plugging connection to be established can serve additionally as a guidance aid and fixing means during arrangement of the connecting support. For the same reasons, it may be advantageous when the connecting support is connected firmly to a contact holder with control contacts which is inserted into the gear mechanism housing.

In particular, the above-mentioned adapter can be used to match the connection system to specific customer wishes with a low level of outlay, without having to change the plugging slot on the motor assembly. If the connecting support is connected to the adapter, this produces a component which has all the functions of the system according to the invention and can be quickly replaced or installed. Particularly in this case, it is advantageous when the connecting support, in particular the supporting structure, is releasably connected to at least one housing part of the motor assembly by means of connecting elements. The ability to exchange the connecting support additionally permits quick replacement of the contained motor electronics, this being advantageous in the event of a fault or when adaptations are required.

If it is not necessary to change over the connecting support quickly, said connecting support may be adhesively bonded to at least one housing part of the motor assembly, this providing a particularly robust design which also virtually excludes the supporting structure from being accidentally engaged in from behind, and thus the damage associated with this. In order to protect the motor electronics, it is advantageous when at least some of the motor electronics are located beneath a cover. This cover may advantageously be designed as an electrical shield.

BRIEF DESCRIPTION OF THE DRAWINGS

The invention will be explained in greater detail using an exemplary embodiment. In the drawings.

DETAILED DESCRIPTION

Figure 1:
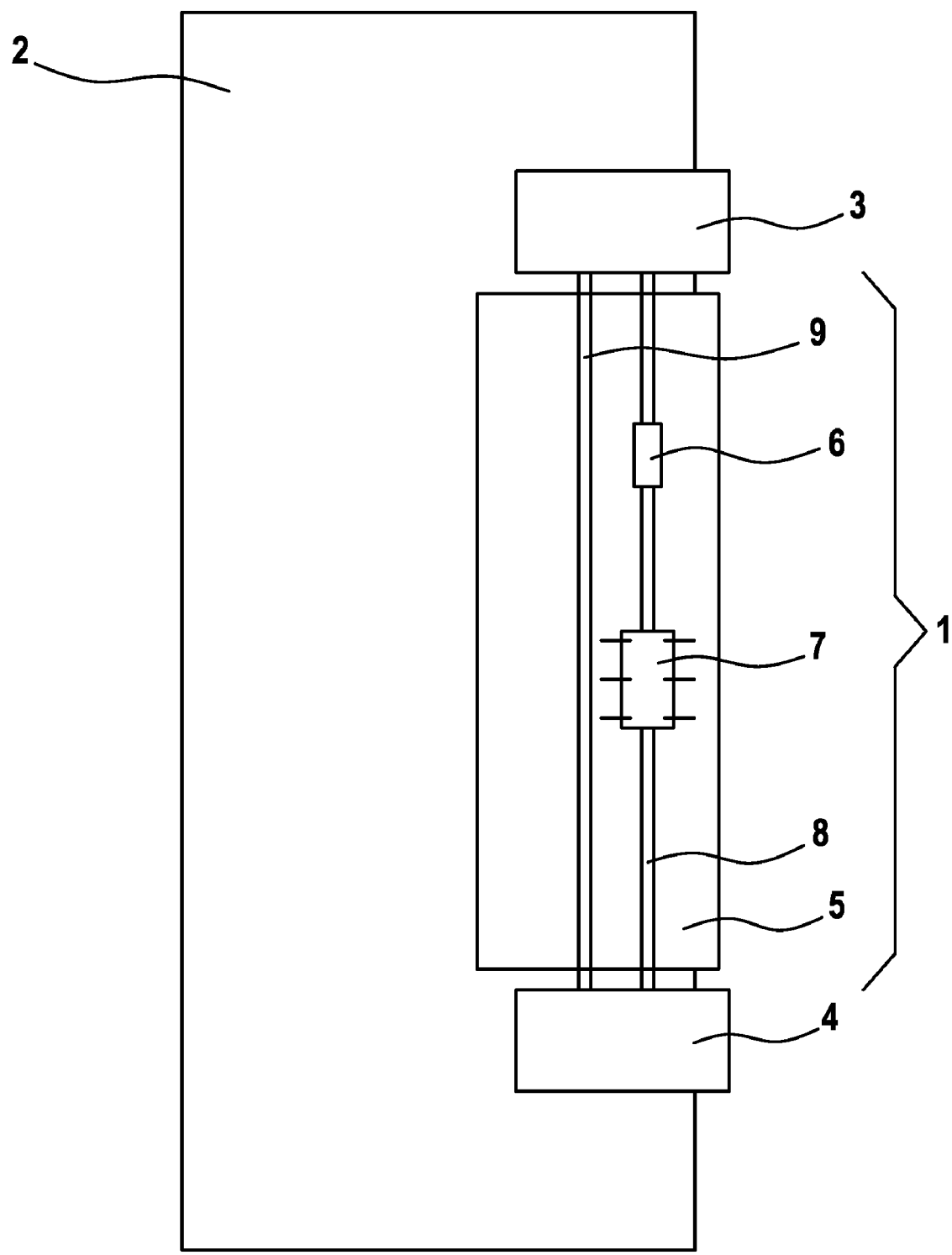
FIG. 1 shows the basic structure of a connecting support according to the invention.

FIG. 1 shows the basic structure of a connecting support 1 according to the invention. Said connecting support is arranged on the outside of a motor assembly 2 and is located between two components 3 and 4 which are arranged at a distance from one another and whose positions in relation to the motor subassembly 2 are fixed. The connecting support 1 comprises a supporting structure 5 to which individual elements of the motor electronics 6, 7 are fixed. The connecting support 1 also comprises electrical connecting means 8, 9 by means of which the adjoining components 3, 4 are electrically connected to one another. This electrical connection can be realized both via the motor electronics 6, 7 and by direct connections with the aid of electrical lines 9. In the case of the direct connections, the connecting support 1 forms a supporting element which defines the geometric profile of the electrical line 9.

Figure 2:
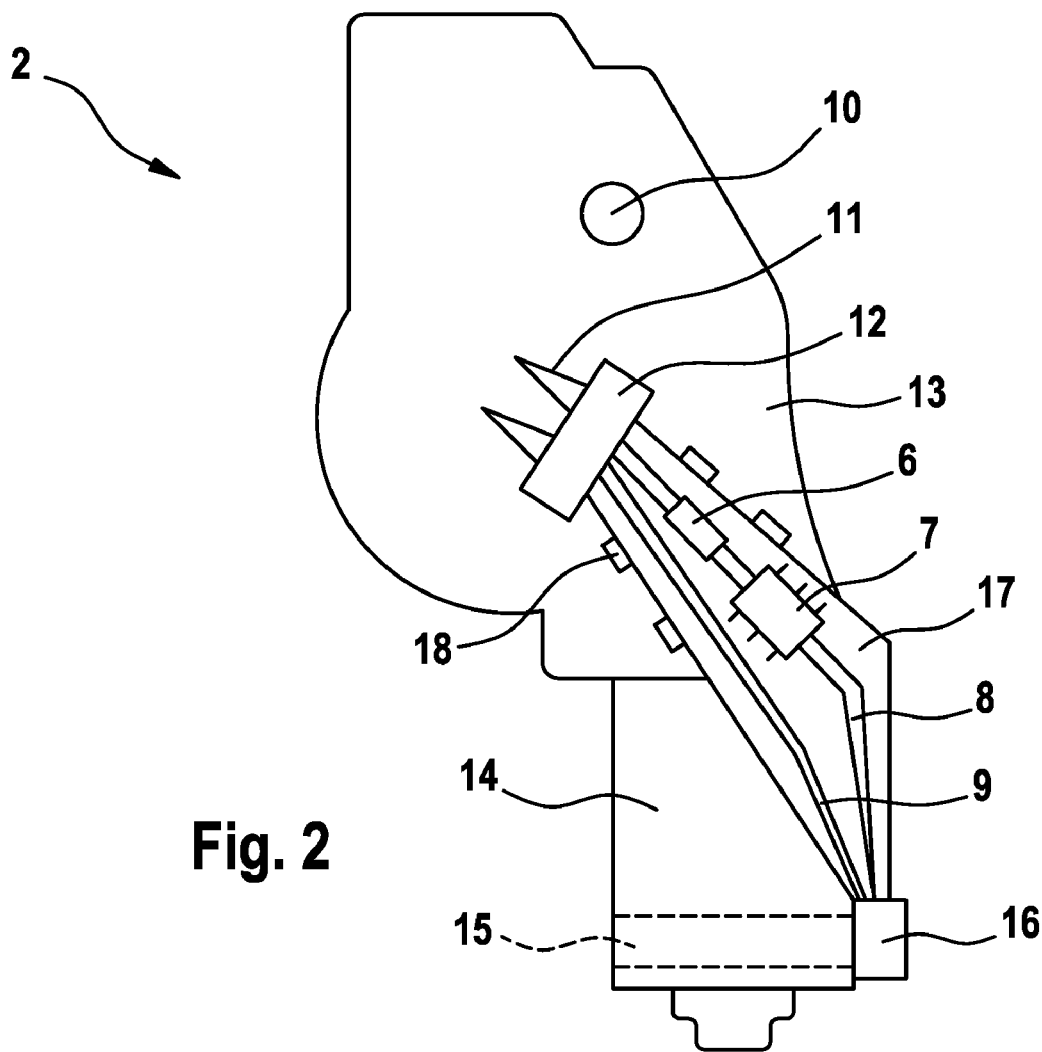
FIG. 2 shows a connecting support according to the invention on the housing of a wiper drive.

FIG. 2 shows a connecting support 1 according to the invention on the housing of a wiper drive. The motor assembly 2 has the typical form of a wiper drive which is designed as an individual drive and which has a wheel crank mechanism. However, use of the invention is in no way restricted to such wiper drives.

Control contacts 11 whose position is determined by fixing a contact holder 12 in an opening in the gear mechanism housing 13 are arranged in order to determine the position of the output shaft 10.

A brush holder 15 which carries the carbon brushes required for operation of the electric motor is located at the lower end of the motor housing 14. The brush holder 15 comprises, on the outside of the motor housing 14, a plugging slot or connection plug by means of which the entire motor assembly is connected. The plug housing 16 comprises all the necessary contacts for this.

For the purposes of the invention, the contact holder 12 with the control contacts 11 and the connection plug with the plug housing 16 form the two components 3 and 4 between which the connecting support 1 is located and which are electrically connected by means of said connecting support. An important constituent part of the connecting support 1 is a supporting structure in the form of a printed circuit board 17 to which elements of the motor electronics 6, 7 are fixed. These elements may comprise, for example, individual active or passive electronic components, various electrical circuits, ASICs or relays. The motor electronics are connected to the connection plug 16 and/or to the contact holder 12 for the control contacts 11 by means of associated conductor tracks 8. Contact springs which are used as control contacts 11 are illustrated. However, electronic contacts in the form of Hall sensors, for example, can likewise be connected by means of a connecting support according to the invention. In addition, direct electrical connections 9 which run as continuous conductor tracks across the printed circuit board are present between the contact holder 12 and the connection plug 16. The distance between the connection plug 16 on the brush holder 15 and the contact holder 12 is bridged substantially by the printed circuit board 17 as a supporting structure which is connected firmly to the plug housing 16. In contrast, the contact holder 12 is connected flexibly to the printed circuit board 17, as a result of which the ability to fit components is improved for specific housing forms. As an alternative to this, refinements are possible in which the contact holder is likewise connected firmly to the supporting structure, here the printed circuit board.

The printed circuit board 17 itself is releasably connected to the gear mechanism housing 13 and the motor housing 14 by means of a plurality of connecting elements 18.

Figure 3:
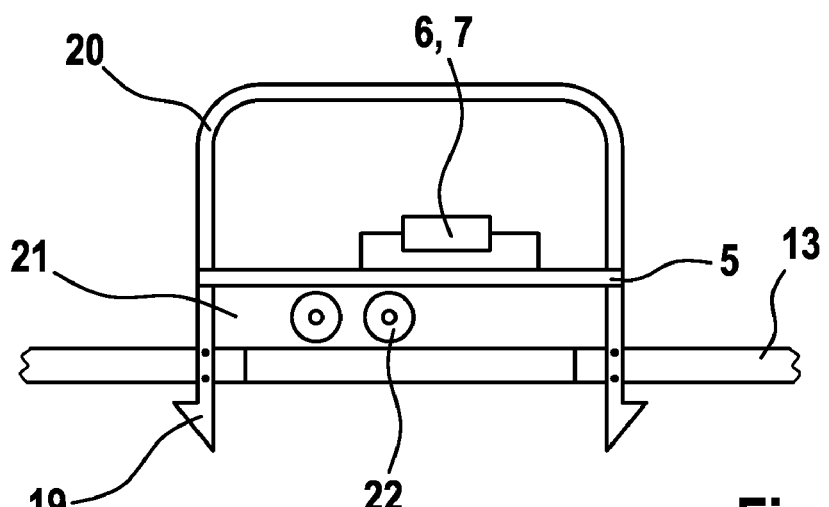
FIG. 3 shows a sectional illustration of a connecting support according to the invention with connecting elements.

FIG. 3 shows a sectional illustration of a connecting support 1 according to the invention with exemplary connecting elements. In order to be able to establish a releasable connection between the supporting structure 5 of the connecting support 1 and a corresponding housing part 13, the supporting structure 5 has elastically deflectable hook elements 19 on its side which is remote from the electronics 6, 7, which hook elements are to be inserted into corresponding openings in the respective housing part 13. The position of the hook elements 19 is selected here such that the hook elements 19 engage behind the perforated housing surface 13 in the inserted state, with this position being adequately ensured by elastic restoring forces. The result is a latching, predominantly interlocking, connection between the supporting structure 5 of the connecting support 1 and the respective housing part 13, which connection can easily be released again by disengaging the hook elements 19. As an alternative to this, complementary latching systems are feasible, in which hook elements which are connected to the housing surfaces engage in corresponding openings in the supporting structure, for example a printed circuit board, and are elastically splayed.

A cover 20 which is designed as a plastic cap and bears a metal coating for electrical shielding purposes is located over the supporting structure in order to protect the motor electronics. As an alternative, electrically conductive polymers and the application of metalized foils, amongst other things, can be used to achieve the shielding effect.

In the present example, a hollow space 21 is left between the hook elements 19, the supporting structure 5 and the housing wall 13, it being possible to use said hollow space as a laying channel for further cables 22, for example for direct connection between the connection plug and the contact holder.

Figure 4:
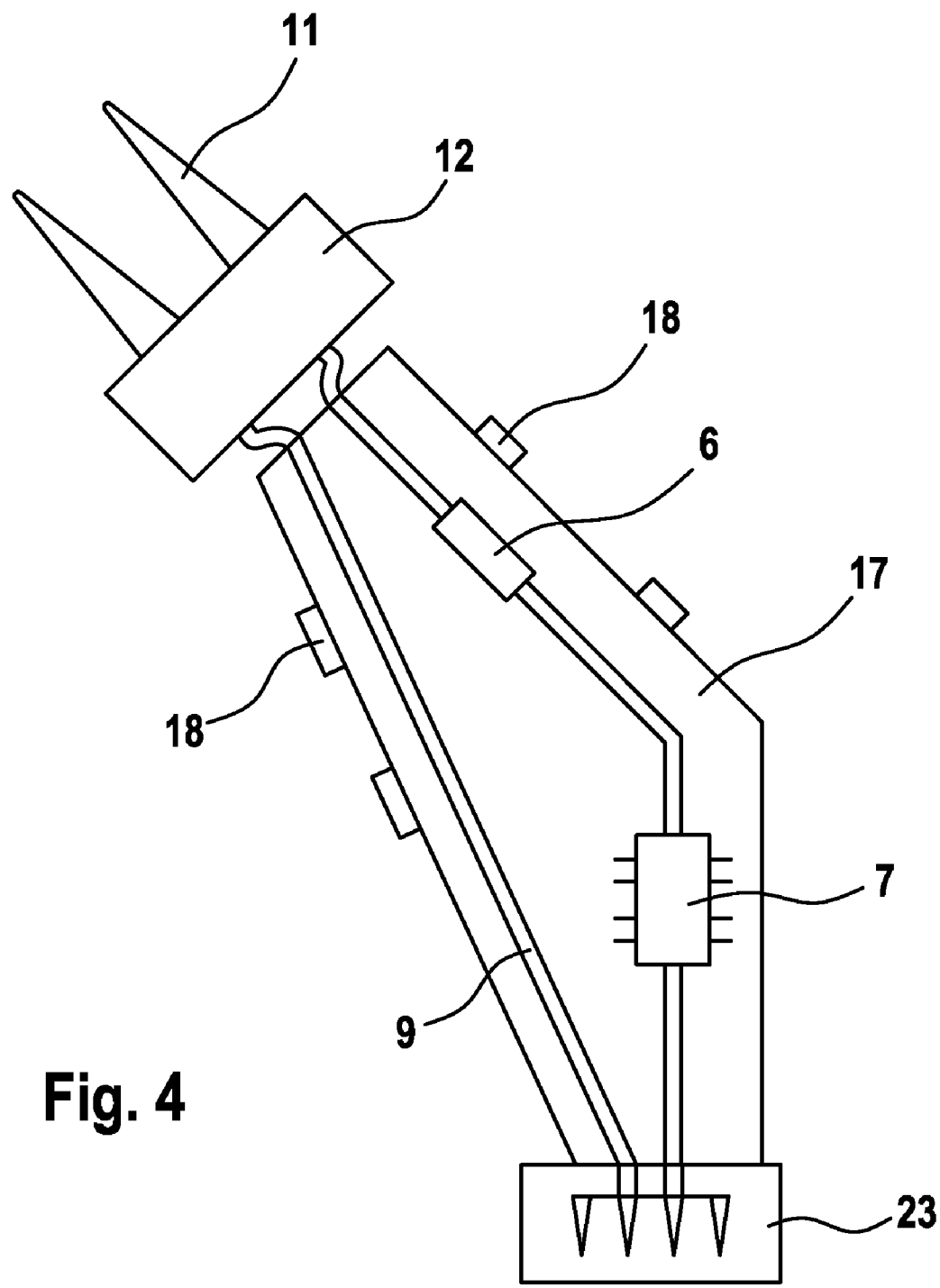
FIG. 4 shows a replaceable component for realizing a connecting support according to the invention.

FIG. 4 shows a replaceable component for realizing a connecting support according to the invention. This component comprises a plugging adapter 23 which is arranged between a connection plug and a plugging slot which is located on the motor housing. A printed circuit board 17 is again arranged on this plugging adapter 23 as the supporting structure. A contact holder 12 with control contacts 11 is fitted to that end of the printed circuit board 17 which is remote from the adapter. The control contacts 11 are connected to corresponding connections in the plugging adapter 23 via the electronics 6, 7 located on the printed circuit board 17 or directly via continuous conductor tracks 9. The inclusion of the plugging adapter 23 in the connection concept means various consumer plugs can be connected to the plugging slot on the motor housing, and various designs of the motor electronics which are matched to the customer's wishes can be used, without structural measures having to be taken on the motor assembly. The described combination of plugging adapter, supporting structure with motor electronics and contact holder with control contacts provides a component which can be quickly replaced and installed and has all the functions of the system according to the invention. During assembly, in the first instance, the contact holder 12 with the control contacts 11 is to be inserted into an opening in the gear mechanism housing, which opening is provided for said contact holder and is to be fixed. The plugging adapter 23 is then placed in the plugging slot on the motor housing and the printed circuit board 17 is fixed. The advantage of the quickly replaceable adapter is retained when the printed circuit is releasably fixed. To this end, the printed circuit board 17 likewise has the above-described connecting elements 18.

The invention claimed is:

1. A connecting support (1) for holding motor electronics on a motor assembly (2), the connecting support being located between at least two components (3, 4) which are arranged at a distance from one another on the motor assembly (2), with the connecting support (1) having means (8, 9) by which these components (3, 4) are electrically connected to one another, wherein the connecting support (1) comprises a supporting structure (5) to which at least individual elements (6, 7) of the motor electronics are fixed, the supporting structure (5) further supporting a plugging adapter (23), which is arranged at one end of the connecting support (1) and is configured to receive various plugs for connecting to a plugging slot of the motor assembly (2), and a contact holder (12) with a control contact (11) arranged at another end of the connecting support (1), the control contact (11) being configured for determining the position of at least one gear mechanism element, and wherein the control contact (11) is directly connected with the plugging adapter (23) by conductor tracks (9) or by individual elements (6, 7) arranged on the connecting support (1).

2. The connecting support (1) as claimed in claim 1, characterized in that the motor assembly (2) is a motor assembly of a wiper drive of a vehicle, comprising electrical connection means (16) for connecting the motor assembly (2).

3. The connecting support (1) as claimed in claim 2, characterized in that the supporting structure (5) comprises conductor tracks (8) which connect at least individual elements (6, 7) of the motor electronics to at least one of the components (3, 4, 12, 16) between which the connecting support (1) is arranged.

4. The connecting support (1) as claimed in claim 3, characterized in that the supporting structure (5) comprises conductor tracks (9) which connect the components (3, 4, 12, 16) between which the connecting support (1) is arranged directly to one another.

5. The connecting support (1) as claimed in claim 4, characterized in that the supporting structure (5) comprises a printed circuit board (17).

6. The connecting support (1) as claimed in claim 5, characterized in that the supporting structure (5) comprises a plastic part with injection-molded conductive strips or injection-molded cables.

7. The connecting support (1) as claimed in claim 6, characterized in that the connecting support (1) is connected to the plugging adapter (23) which is arranged between a plug, by means of which the connection is made with the motor assembly (2), and a corresponding plugging slot.

8. The connecting support (1) as claimed in claim 7, characterized in that the supporting structure (5) is releasably connected to at least one housing part (13, 14) of the motor assembly (2) by means of a plurality of connecting elements (18, 19), or is adhesively bonded to at least one housing part (13, 14) of the motor assembly (2).

9. The connecting support (1) as claimed in claim 8, characterized in that at least some of the motor electronics are located beneath a cover (20).

10. The connecting support as claimed in claim 8, characterized in that at least some of the motor electronics are located beneath an electrically shielding cover (20).

11. The connecting support (1) as claimed in claim 1, characterized in that the supporting structure (5) comprises conductor tracks (8) which connect at least individual elements (6, 7) of the motor electronics to at least one of the components (3, 4, 12, 16) between which the connecting support (1) is arranged.

12. The connecting support (1) as claimed in claim 1, characterized in that the supporting structure (5) comprises conductor tracks (9) which connect the components (3, 4, 12, 16) between which the connecting support (1) is arranged directly to one another.

13. The connecting support (1) as claimed in claim 1, characterized in that the supporting structure (5) comprises a printed circuit board (17).

14. The connecting support (1) as claimed in claim 1, characterized in that the supporting structure (5) comprises a plastic part with injection-molded conductive strips or injection-molded cables.

15. The connecting support (1) as claimed in claim 1, characterized in that the connecting support (1) is connected to the plugging adapter (23) which is arranged between a plug, by means of which the connection is made with the motor assembly (2), and a corresponding plugging slot.

16. The connecting support (1) as claimed in claim 1, characterized in that the supporting structure (5) is releasably connected to at least one housing part (13, 14) of the motor assembly (2) by means of a plurality of connecting elements (18, 19), or is adhesively bonded to at least one housing part (13, 14) of the motor assembly (2).

17. The connecting support (1) as claimed in claim 1, characterized in that at least some of the motor electronics are located beneath a cover (20).

18. The connecting support as claimed in claim 1, characterized in that at least some of the motor electronics are located beneath an electrically shielding cover (20).

* * * * *